United States Patent
Yamada

(10) Patent No.: US 8,502,523 B2
(45) Date of Patent: Aug. 6, 2013

(54) TEST APPARATUS AND TEST METHOD

(75) Inventor: Tatsuya Yamada, Saitama (JP)

(73) Assignee: Advantest Corporation, Tokyo (JP)

(*) Notice: Subject to any disclaimer, the term of this patent is extended or adjusted under 35 U.S.C. 154(b) by 328 days.

(21) Appl. No.: 13/024,264

(22) Filed: Feb. 9, 2011

(65) Prior Publication Data

US 2011/0199133 A1 Aug. 18, 2011

Related U.S. Application Data

(63) Continuation of application No. PCT/JP2009/004367, filed on Sep. 3, 2009.

(30) Foreign Application Priority Data

Sep. 5, 2008 (JP) ................................ 2008-229009

(51) Int. Cl.
G01R 23/00 (2006.01)

(52) U.S. Cl.
USPC ................... 324/76.52; 324/762.01; 324/537; 714/744; 327/141

(58) Field of Classification Search
USPC ......... 324/762.01, 76.77, 76.52, 537, 750.01; 714/724, 744; 327/141
See application file for complete search history.

(56) References Cited

U.S. PATENT DOCUMENTS

| | | | | |
|---|---|---|---|---|
| 4,860,291 | A * | 8/1989 | Damm et al. ................. | 714/744 |
| 5,406,198 | A * | 4/1995 | Orihashi et al. ......... | 324/750.02 |
| 7,382,146 | B2 * | 6/2008 | Negishi .................... | 324/762.01 |
| 7,805,641 | B2 * | 9/2010 | Yamada et al. ............... | 714/700 |
| 2007/0214437 | A1 | 9/2007 | Kajihara | |
| 2008/0122501 | A1 | 5/2008 | Narusawa et al. | |
| 2011/0010681 | A1 | 1/2011 | Kajihara | |

FOREIGN PATENT DOCUMENTS

JP 63-111480 A 5/1988

(Continued)

OTHER PUBLICATIONS

International Search Report (ISR) issued in PCT/JP2009/004367 (parent application) mailed in Dec. 2009.

(Continued)

Primary Examiner — Arleen M Vazquez

(57) ABSTRACT

Provided is a test apparatus and a test method for substantially synchronizing phases of test signals for each of a plurality of clock domains. The test apparatus tests a device under test including a plurality of clock domains. The test apparatus comprises a period generator that generates a rate signal for determining a test period corresponding to an operation period of the device under test; a pattern generator that generates a test pattern; phase comparing sections that, for each clock domain, receive an operation clock signal of the clock domain acquired from a terminal of the device under test included in the clock domain, and detect a phase difference of the operation clock signal of the clock domain with respect to the rate signal; and a plurality of waveform shaping sections that are provided respectively to the clock domains, and that each shape a test signal based on the test pattern, according to the phase difference of the corresponding clock domain, to substantially synchronize the test signal with the operation clock signal of the corresponding clock domain.

7 Claims, 8 Drawing Sheets

FOREIGN PATENT DOCUMENTS

| | | |
|---|---|---|
| JP | 1-254877 A | 10/1989 |
| JP | 3-200081 A | 9/1991 |
| JP | H06-188635 A | 7/1994 |
| JP | 9-330217 A | 12/1997 |
| JP | 2007-251265 A | 9/2007 |
| JP | 2008-136030 A | 6/2008 |
| TW | 200736642 A | 10/2007 |

OTHER PUBLICATIONS

Written Opinion (PCT/ISA/237) issued in PCT/JP2009/004367 (parent application) mailed in Dec. 2009.

TW Office Action and English Translation Dated Mar. 26, 2013; Application No. 098129865.

* cited by examiner

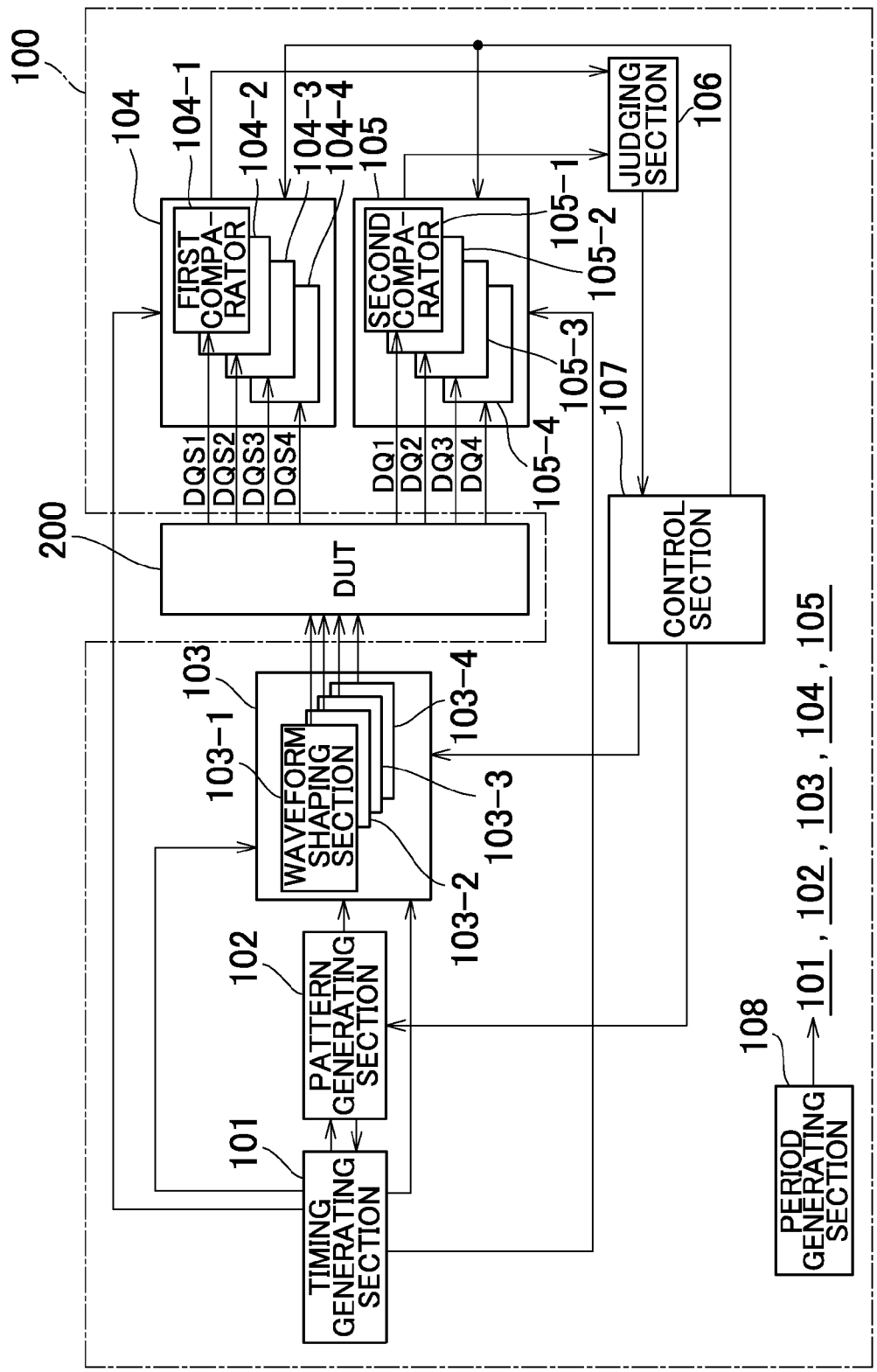
F I G. 1

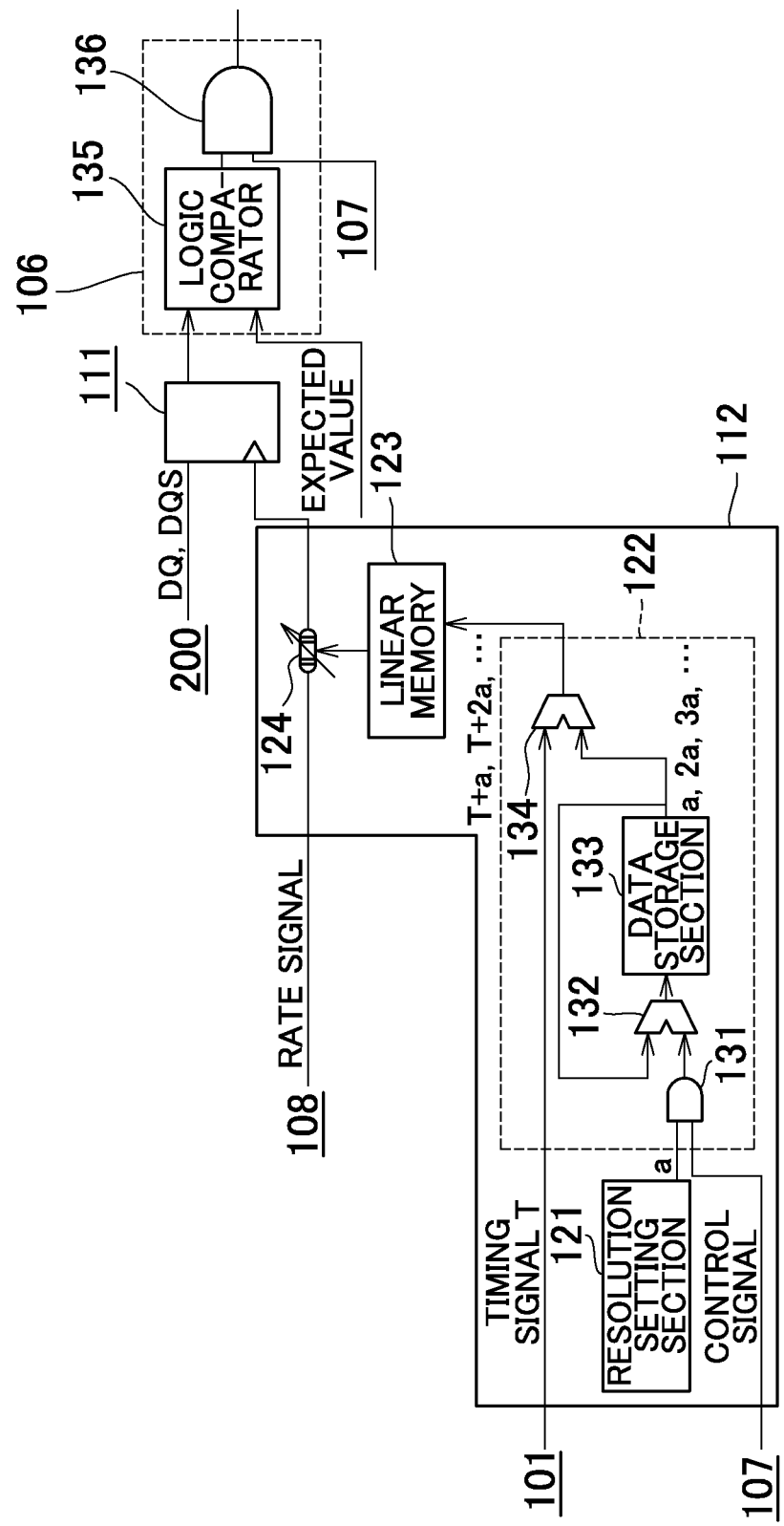
F I G. 2

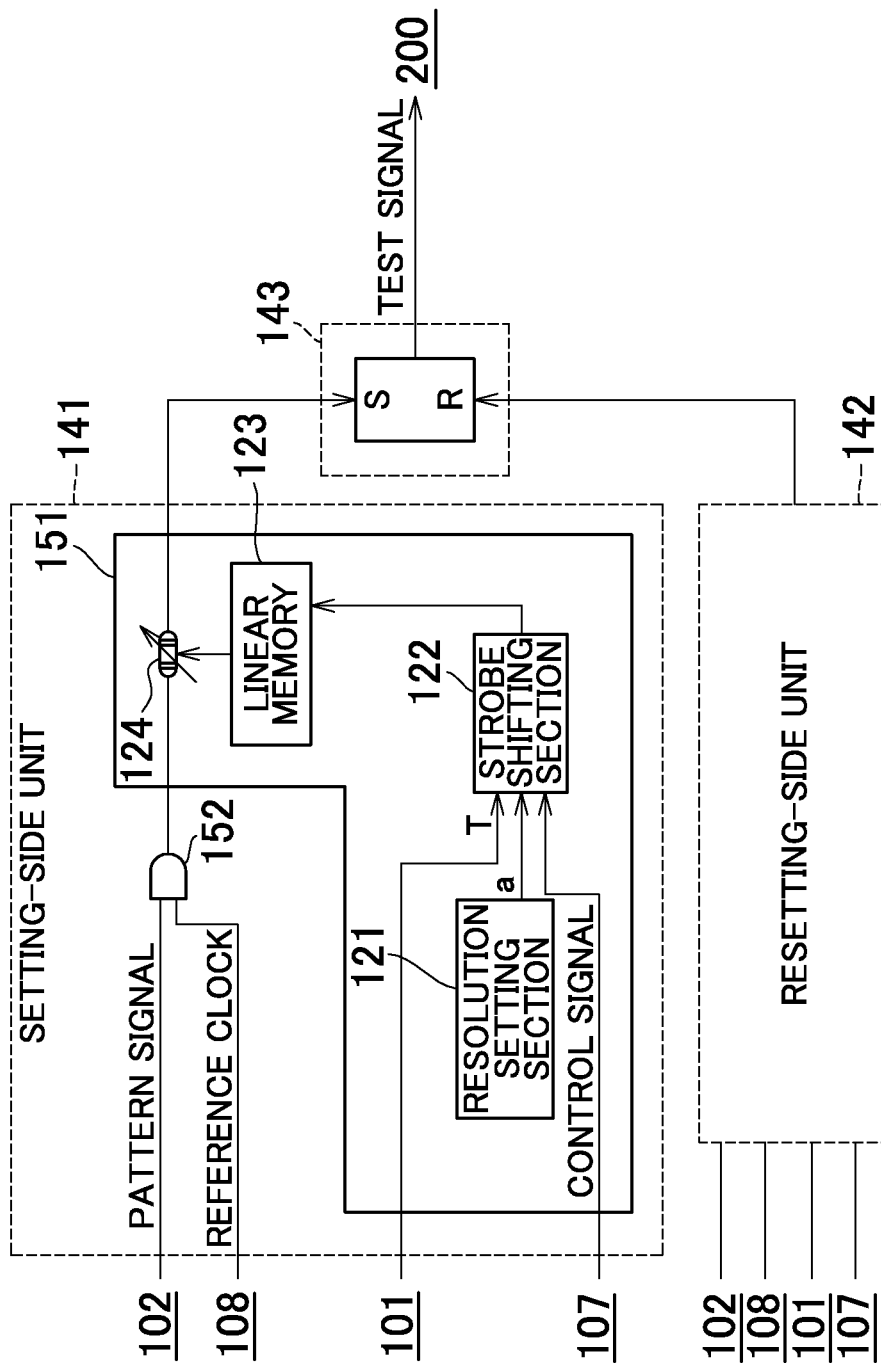
F I G. 3

| ADDRESS | FIRST CLOCK DOMAIN | | SECOND CLOCK DOMAIN | | THIRD CLOCK DOMAIN | | FOURTH CLOCK DOMAIN | | OTHER | |
|---|---|---|---|---|---|---|---|---|---|---|
| | COMPA- RATOR ENABLE | EDGE SHIFT ENABLE | COMPA- RATOR ENABLE | EDGE SHIFT ENABLE | COMPA- RATOR ENABLE | EDGE SHIFT ENABLE | COMPA- RATOR ENABLE | EDGE SHIFT ENABLE | COMPA- RATOR ENABLE | EDGE SHIFT ENABLE |
| 0 | ENABLE | ENABLE | ENABLE | ENABLE | ENABLE | ENABLE | ENABLE | ENABLE | ENABLE | DISABLE |
| 1 | ENABLE | ENABLE | DISABLE | DISABLE | DISABLE | DISABLE | DISABLE | DISABLE | ENABLE | DISABLE |
| 2 | DISABLE | DISABLE | ENABLE | ENABLE | ENABLE | ENABLE | DISABLE | DISABLE | ENABLE | DISABLE |
| 3 | DISABLE | DISABLE | DISABLE | DISABLE | ENABLE | ENABLE | ENABLE | ENABLE | ENABLE | DISABLE |
| 4 | DISABLE | DISABLE | DISABLE | DISABLE | DISABLE | DISABLE | ENABLE | ENABLE | ENABLE | DISABLE |

F I G . 4

```
        ST| 3                        : SET THE NUMBER OF DG/DQS PAIRS - 1
DUTLP:  INCPCTAP
ESLP:   NOP     /MTV                 : COMPARE DQS HERE
        IF (!pass) JMP ESLP ES_ADD   : SHIFT EDGE AND LOOP UNTIL THE
        JNI DUTLP                      COMPARE RESULT MATCHES
        SETPCTAP 0                   : LOOP FOR EACH DQ/DQS PAIRS
                                     : RESTORE DEFAULT ADDRESS VALUE
```

FIG. 6

| ADDRESS | ENABLE |
|---|---|
| 0 | DISABLE |
| 1 | DISABLE |
| 2 | ENABLE |
| 3 | ENABLE |
| 4 | DISABLE |

FIG. 7

| ADDRESS | COMPARATOR ENABLE |
|---|---|
| 0 | DISABLE |
| 1 | DISABLE |
| 2 | ENABLE |
| 3 | DISABLE |
| 4 | ENABLE |

F I G . 8

TEST APPARATUS AND TEST METHOD

BACKGROUND

1. Technical Field

The present invention relates to a test apparatus and a test method. In particular, the present invention relates to a test apparatus and a test method for adjusting timing of test signals supplied to a device under test.

2. Related Art

A test apparatus inputs an operation clock signal to a device under test to cause the device under test to operate according to the operation clock signal. Specifically, the operation clock signals are synchronized between the test apparatus and the device under test, and so the test apparatus can supply the test signal to the device under test based on the operation clock signal or acquire an output signal from the device under test based on the operation clock signal.

Patent Document 1: Japanese Patent Application Publication No. H06-188635

Depending on the type of device under test, operation clock signals can be generated by independent oscillation circuits to operate independently from the test apparatus. In this case, the operation clock signals cannot be synchronized between the test apparatus and the device under test. Therefore, the test apparatus cannot supply the device under test with a test signal and cannot acquire the output signal from the device under test.

Patent Document 1 proposes adjusting the waveform of a signal by controlling a frequency divider according to values stored in a memory. This technique simply requires storing one cycle of data in the memory, and can therefore decrease the amount of memory necessary for waveform shaping. However, Patent Document 1 merely describes a waveform shaping method, and does not describe how signals can be synchronized by applying this waveform shaping.

Furthermore, if the device under test has a plurality of clock domains, the phase of the test signal for each clock domain cannot be synchronized.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test apparatus that tests a device under test including a plurality of clock domains. The test apparatus comprises a period generator that generates a rate signal for determining a test period corresponding to an operation period of the device under test; a pattern generator that generates a test pattern; phase comparing sections that, for each clock domain, receive an operation clock signal of the clock domain acquired from a terminal of the device under test included in the clock domain, and detect a phase difference of the operation clock signal of the clock domain with respect to the rate signal; and a plurality of waveform shaping sections that are provided respectively to the clock domains, and that each shape a test signal based on the test pattern, according to the phase difference of the corresponding clock domain, to substantially synchronize the test signal with the operation clock signal of the corresponding clock domain.

The test apparatus may further comprise a control table that stores, in association with each of a plurality of addresses, enable information or disable information for enabling or disabling operation of the phase comparing section and the waveform shaping section of each clock domain. The operation of the phase comparing sections or the waveform shaping sections may be dynamically controlled according to designation of the addresses by a test program for shaping the test signals.

The test apparatus may further comprise an address pointer that stores the addresses. A pointer value of the address pointer may be incremented or decremented by control commands designated by the test program to dynamically control the operation of the phase comparing sections or the waveform shaping sections.

The test apparatus may further comprise a delay amount storage section that stores delay amounts for the waveform shaping sections. Each waveform shaping section repeats a delay operation using a delay amount stored in the delay amount storage section one or more times to shape the test signal according to the phase difference.

The test apparatus may further comprise a plurality of test signal output sections that correspond respectively to the clock domains and that each supply the device under test with a delayed test signal of the corresponding clock domain. The control table may further store, in association with each of the addresses, enable information or disable information for enabling or disabling operation of the test signal output section of each clock domain.

The test apparatus may further comprise a second control table that stores, in association with each of a plurality of addresses, table enable information or table disable information for enabling or disabling the control table. For addresses corresponding to table enable information stored in the second control table, when every corresponding address in the control table stores enable information or when one of the corresponding addresses in the control table stores enable information, the operation of the phase comparing sections or the waveform shaping sections may be enabled.

According to a second aspect related to the innovations herein, provided is a test method for testing a device under test including a plurality of clock domains. The test method comprising generating a rate signal for determining a test period corresponding to an operation period of the device under test; generating a test pattern; for each clock domain, receiving an operation clock signal of the clock domain acquired from a terminal of the device under test included in the clock domain, and detecting a phase difference of the operation clock signal of each domain clock with respect to the rate clock; and for each clock domain, forming a test signal based on the test pattern, according to the phase difference of the corresponding clock domain, to substantially synchronize the test signal with the operation clock signal of the corresponding clock domain.

The summary clause does not necessarily describe all necessary features of the embodiments of the present invention. The present invention may also be a sub-combination of the features described above.

BRIEF DESCRIPTION OF THE DRAWINGS

FIG. 1 shows an overall configuration of the test apparatus 100.

FIG. 2 shows an exemplary configuration of one of the first comparators 104-1 to 104-4 or second comparators 105-1 to 105-4.

FIG. 3 shows an exemplary configuration of one of the waveform shaping sections 103-1 to 103-4.

FIG. 4 shows an exemplary control table.

FIG. 6 shows an exemplary command group included in the test program supplied to the control section 107.

FIG. 7 shows an exemplary second control table according to a modification.

FIG. 8 shows an exemplary state of a control table according to the modification.

DESCRIPTION OF EXEMPLARY EMBODIMENTS

Figure 5:
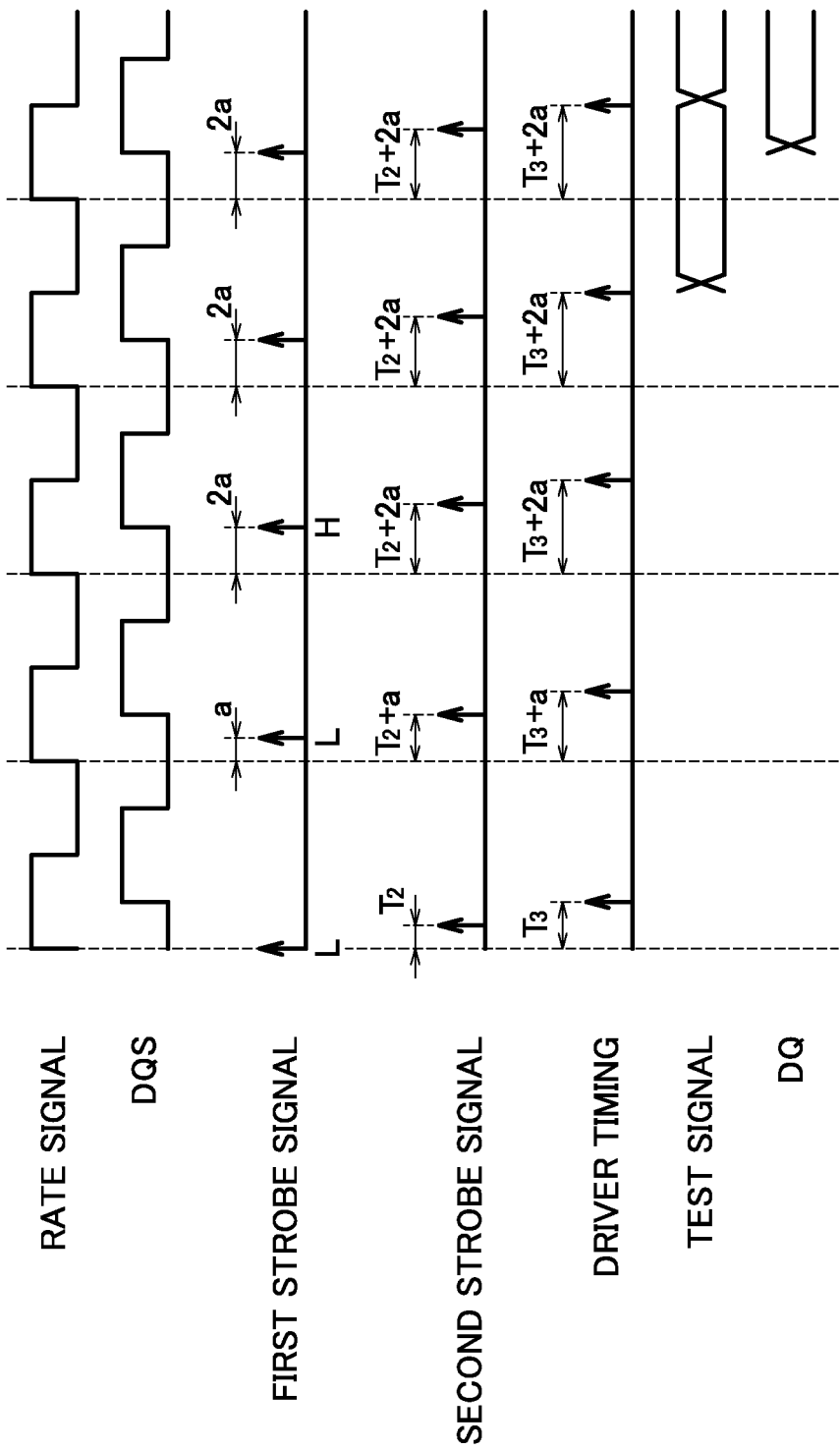
FIG. 5 is a timing chart showing an exemplary operation of the test apparatus 100.

Hereinafter, an embodiment of the present invention will be described. The embodiment does not limit the invention according to the claims, and all the combinations of the features described in the embodiments are not necessarily essential to means provided by aspects of the invention.

FIG. 1 shows an overall configuration of the test apparatus 100. The test apparatus 100 detects a phase difference between an operation clock signal of each clock domain of a device under test (DUT) 200 and a rate signal generated by the test apparatus 100. The test apparatus 100 correctly tests the device under test by delaying the test signal input to each clock domain of the DUT 200 according to the corresponding detected phase difference. As a result, the test apparatus 100 can correctly test a device under test that is an electronic device having a plurality of independent oscillation circuits.

The test apparatus 100 includes a timing generator 101, a pattern generator 102, waveform shaping sections 103, first comparators 104, second comparators 105, a judging section 106, a control section 107, and a period generator 108. The DUT 200 generates a plurality of independent operation clock signals that differ from each other. The DUT 200 has a clock domain that operates for each of the different operation clock signals. Each clock domain may acquire the corresponding operation clock signal from the outside, and operate according to the acquired operation clock signal.

The timing generator 101 generates a timing signal causing the test apparatus 100 to operate. For example, the timing generator 101 may receive from the pattern generator 102 a test setting signal that indicates the timing at which the test pattern is supplied to the electronic device. The timing generator 101 supplies each waveform shaping section 103 with a signal indicating the timing for supplying the test pattern to the DUT 200. The pattern generator 102 generates test patterns for testing the DUT 200. The pattern generator 102 supplies the generated test patterns to the waveform shaping sections 103.

Each waveform shaping section 103 shapes a test signal with a prescribed waveform according to the timing signal received from the timing generator 101, based on the test pattern received from the timing generator 101. Each waveform shaping section 103 supplies the DUT 200 with the shaped test signal. Each first comparator 104 detects an operation clock signal DQS output by the DUT 200, at the timing indicated by a first strobe signal. Each first comparator 104 outputs to the judging section 106 the detected operation clock signal DQS. Each second comparator 105 detects a data signal DQ output by the DUT 200 in response to the test pattern supplied thereto, at the timing indicated by a second strobe signal. Each second comparator 105 outputs the acquired data signal DQ to the judging section 106. The strobe signal includes a signal indicating a timing having a relative phase with respect to the rate signal.

The test apparatus 100 includes a plurality of waveform shaping sections 103, first comparators, and second comparators. The waveform shaping sections 103-1 to 103-4, first comparators 104-1 to 104-4, and second comparators 105-1 to 105-4 correspond respectively to clock domains of the DUT 200. Here, the waveform shaping section 103-1, the first comparator 104-1, and the second comparator 105-1 correspond to a first clock domain. The waveform shaping section 103-2, the first comparator 104-2, and the second comparator 105-2 correspond to a second clock domain. The waveform shaping section 103-3, the first comparator 104-3, and the second comparator 105-3 correspond to a third clock domain. The waveform shaping section 103-4, the first comparator 104-4, and the second comparator 105-4 correspond to a fourth clock domain.

Each of the waveform shaping sections 103-1 to 103-4 supplies the shaped test signal to the corresponding clock domain. For example, the waveform shaping section 103-2 supplies the test signal shaped thereby to the second clock domain. Each clock domain of the DUT 200 outputs a data signal DQ in response to the received test signal. Here, the first clock domain has an operation clock signal DQS1 and output data DQ1. The second clock domain has an operation clock signal DQS2 and output data DQ2. The third clock domain has an operation clock signal DQS3 and output data DQ3. The fourth clock domain has an operation clock signal DQS4 and output data DQ4.

Each of the first comparators 104-1 to 104-4 acquires the operation clock signal DQS output by a corresponding clock domain terminal of the DUT 200, at the timing indicated by the first strobe signal. For example, the first comparator 104-3 detects the operation clock signal DQS3 output by the third clock domain, at the timing indicated by the first strobe signal. Each of the second comparators 105-1 to 105-4 detects the data signal DQ output by the corresponding clock domain of the DUT 200 in response to the test signal, at the timing indicated by the second strobe signal. For example, the second comparator 105-1 detects the data signal DQ1 output by the first clock domain in response to the test signal supplied to the first clock domain, at the timing indicated by the second strobe signal. The phase of the first strobe signal may be different for each first comparator 104. The phase of the second strobe signal may be difference for each second comparator 105.

The judging section 106 judges pass/fail of the DUT 200, based on the logic values of the output signals detected by the first comparators 104 and the second comparators 105. For example, the judging section 106 may judge pass/fail of the DUT 200 by comparing the logic values of the data signals DQ to expected logic values. The judging section 106 may detect phase differences between the operation clock signals DQS and the data signals DQ, based on differences in transition timings between the logic values detected by the first comparators 104 and the second comparators 105. The judging section 106 may judge pass/fail of the DUT 200 based on whether this phase difference is within a prescribed range.

The judging section 106 may judge pass fail of each clock domain of the DUT 200, based on the logic values of the corresponding output signals detected by the first comparators 104-1 to 104-4. The judging section 106 may detect the phase difference between the operation clock signal DQS and the data signal DQ of each clock domain, based on the difference in transition timing of the logic values detected by the corresponding first comparators 104-1 to 104-4 and second comparators 105-1 to 105-4. The judging section 106 may judge pass/fail of each clock domain based on whether the corresponding phase difference is within a prescribed range.

The judging section 106 compares the logic values of the operation clock signals DQS detected by the first comparators 104 to prescribed expected values to judge whether the phases match. The judging section 106 outputs the judgment results to the control section 107.

The control section 107 controls testing of the DUT 200 by the test apparatus 100. The period generator 108 supplies each component of the test apparatus 100 with a reference clock. The period generator 108 generates the rate signal that determines the test period corresponding to the operation of the DUT 200. The period generator 108 supplies each component of the test apparatus 100 with the generated test period.

FIG. 2 shows exemplary configurations of one of the first comparators 104-1 to 104-4 or second comparators 105-1 to 105-4 and the judging section 106 shown in FIG. 1. The first comparators 104-1 to 104-4 and second comparators 105-1 to 105-4 may each have the same configuration. The first comparators 104-1 to 104-4 and second comparators 105-1 to 105-4 may be referred to hereinafter generically as a "comparator."

The comparator includes a timing comparator 111 and a strobe generating section 112. The timing comparator 111 detects the logic value of an output signal, i.e. DQ or DQS, of a clock domain of the DUT 200, according to the strobe signal supplied thereto, i.e. the first strobe signal or the second strobe signal. The timing comparator 111 outputs the detected logic value to the judging section 106. The judging section 106 includes a logic comparing section 135 and an AND circuit 136, and uses the logic comparing section 135 to compare the logic value detected by the timing comparator 111 to an expected value. The comparison result of the logic comparing section 135, which is a pass/fail result of a test, is input to the AND circuit 136, and is output from the AND circuit 136 when the control signal from the control section 107 is logic H.

The strobe generating section 112 includes a resolution setting section 121, a strobe shifting section 122, a linear memory 123, and a delay element 124. The resolution setting section 121 stores a resolution "a" indicating a unit change amount for each cycle used when the phase of the strobe signal sequentially changes in each cycle of the rate signal. The strobe generating section 112 receives a timing signal T, which indicates an initial value of a relative phase with respect to the rate signal, from the timing generator 101. The resolution "a" and the relative phase of the timing signal T received from the timing generator 101 may be set in advance by a user. For example, the control section 107 may perform the setting according to a test program provided by the user. The timing signal T may be different for each comparator. The timing signal T may be different for the first comparators 104 than for the second comparators 105.

The strobe shifting section 122 includes an AND circuit 131, a shift adding section 132, a data storage section 133, and an offset adding section 134. The AND circuit 131 outputs the AND of the control signal and the resolution "a" received from the resolution setting section 121. The resolution setting section 121 outputs the resolution "a" when a control signal of logic H is supplied thereto. The resolution setting section 121 does not output the resolution "a" when a control signal of logic L is supplied thereto.

The shift adding section 132 adds together the resolution "a" passed by the AND circuit 131 and the data value of the data output by the data storage section 133, and outputs the resulting sum. The data storage section 133 stores and outputs the data output by the shift adding section 132. In other words, when the control signal of logic H is being supplied to the AND circuit 131, the value of the data output by the shift adding section 132 sequentially increases by the resolution "a" to have a value of a, 2a, 3a, etc. The shift adding section 132 may add together the resolution "a" and the data output by the data storage section 133, and output the resulting sum in synchronization with the rate signal. The control section 107 supplies the AND circuit 131 with the control signal of logic H until the phase of the first strobe signal substantially matches the phase of the operation clock signal DQS. When the phase of the first strobe signal substantially matches the phase of the operation clock signal DQS, the control section 107 switches the logic value of the control signal to logic L.

The offset adding section 134 adds together the data value output by the data storage section 133 and the data value of the timing signal T, and outputs the resulting sum to the linear memory 123. The data value output by the strobe shifting section 122 is referred to as "delay setting data." The linear memory 123 supplies the delay element 124 with a control signal corresponding to the delay setting data received from the strobe shifting section 122. The linear memory 123 may store a table that associates each piece of delay setting data with a control signal to be supplied to the delay element 124. For example, the linear memory 123 may associate the control signals with the pieces of delay setting data such that the delay amount indicated by each piece of delay setting data matches a delay amount that is actually generated by the delay element 124. The delay element 124 delays the rate signal received from the period generator 108 by the delay amount corresponding to the received control signal, and outputs the result to the timing comparator 111 as the strobe signal, i.e. the first strobe signal or the second strobe signal.

FIG. 3 shows an exemplary configuration of one of the waveform shaping sections 103-1 to 103-4. The waveform shaping sections 103-1 to 103-4 may each have the same configuration. The waveform shaping sections 103-1 to 103-4 may be referred to generically as a "waveform shaping section 103." The waveform shaping section 103 includes a setting-side unit 141, a resetting-side unit 142, and a test signal supplying section 143. The setting-side unit 141 determines the timing at which the test signal changes from a first logic value to a second logic value. The resetting-side unit 142 determines the timing at which the test signal changes from the second logic value to the first logic value. The setting-side unit 141 may determine the timing at which the test signal changes from logic L to logic H. The resetting-side unit 142 may determine the timing at which the test signal changes from logic H to logic L.

The test signal supplying section 143 changes the logic value of the test signal according to the signal received from the setting-side unit 141. Furthermore, the test signal supplying section 143 changes the logic value of the test signal according to the signal received from the resetting-side unit 142. As a result, the test signal supplying section 143 outputs the pattern signal received from the pattern generator 102, at the timing corresponding to the phase difference with respect to the rate signal.

The setting-side unit 141 includes an AND circuit 152 and a driver timing generating section 151. The driver timing generating section 151 generates a driver timing. The driver timing includes a timing that has a relative phase difference with respect to the rate signal. The driver timing generating section 151 may have the same configuration as the strobe generating section 112 described in FIG. 2. The driver timing generating section 151 receives, from the timing generator 101, the timing signal T indicating the initial value of the relative phase with respect to the rate signal. The driver timing generating section 151 includes the resolution setting section 121, the strobe shifting section 122, the linear memory 123, and the delay element 124.

The resolution setting section 121 stores a resolution "a" indicating a unit change amount for each cycle used when the phase of the drive timing sequentially changes in each cycle of the rate signal. The resolution "a" and the relative phase with respect to the rate signal of the timing signal T received from the timing generator 101 may be set in advance by a user. For example, the control section 107 may perform the setting according to a program provided by the user. The resolution "a" set in the first comparators 104-1 to 104-4, the second comparators 105-1 to 105-4, and the waveform shaping sections 103-1 to 103-4 may be different for each clock domain.

The strobe shifting section 122 may have the same configuration as the strobe shifting section 122 shown in FIG. 2. The strobe shifting section 122 includes the AND circuit 131, the shift adding section 132, the data storage section 133, and the offset adding section 134. The AND circuit 131 outputs the AND of the control signal and the resolution "a" received from the resolution setting section 121.

The shift adding section 132 adds together the resolution "a" passed by the AND circuit 131 and the data value of the data output by the data storage section 133, and outputs the resulting sum. The data storage section 133 stores and outputs the data output by the shift adding section 132. In other words, when the control signal of logic H is being supplied to the AND circuit 131, the value of the data output by the shift adding section 132 sequentially increases by the resolution "a" to have a value of a, 2a, 3a, etc. By repeating the delay operation using the delay amount stored in the resolution setting section 121 in this manner one or more times, the test signal and driver timing can be shaped according to the phase difference. This delay operation may include an operation of setting the delay amount by the first strobe signal. In other words, this delay amount may be determined according to the amount by which the first strobe signal is delayed. The shift adding section 132 may add together the resolution "a" and the data output by the data storage section 133, and output the resulting sum in synchronization with the rate signal. The control section 107 supplies the AND circuit 131 with the control signal of logic H until the phase of the first strobe signal substantially matches the phase of the operation clock signal DQS. When the phase of the first strobe signal substantially matches the phase of the operation clock signal DQS, the control section 107 switches the logic value of the control signal to logic L.

The offset adding section 134 adds together the data value output by the data storage section 133 and the data value of the timing signal T, and outputs the resulting sum to the linear memory 123. The data value output by the strobe shifting section 122 is referred to as "delay setting data." The linear memory 123 supplies the delay element 124 with a control signal corresponding to the delay setting data received from the strobe shifting section 122. The linear memory 123 may store a table that associates each piece of delay setting data with a control signal to be supplied to the delay element 124. For example, the linear memory 123 may associate the control signals with the pieces of delay setting data such that the delay amount indicated by each piece of delay setting data matches a delay amount that is actually generated by the delay element 124.

The delay element 124 receives the AND of the reference clock and the pattern signal output by the AND circuit 152. The delay element 124 delays the signal output by the AND circuit 152 by the delay amount corresponding to the control signal received from the linear memory 123, and outputs the delayed signal to the setting-side terminal of the test signal supplying section 143. The timing of this output by the delay element 124 is the driver timing. The phase of the test signal is determined by the driver timing. Aside from outputting a signal to the resetting-side terminal of the test signal supplying section 143, the resetting-side unit 142 has substantially the same configuration as the setting-side unit 141.

Returning to FIG. 1, the control section 107 controls the first comparators 104, the second comparators 105, and the waveform shaping sections 103 corresponding to the clock domains to be in synchronization with the corresponding clock domains.

The control section 107 transmits the control signal of logic H to the AND circuit 131 in each of the first comparator 104, the second comparator 105, and the waveform shaping section 103 corresponding to a given clock domain, thereby sequentially increasing the data value of the data storage section 133 in each of the first comparator 104, the second comparator 105, and the waveform shaping section 103 corresponding to this clock domain to be a, 2a, 3a, etc. When it is judged that the first strobe signal and the operational clock signal DQS of this first comparator 104 have matching phases, the control section 107 transmits the control signal of logic L to the AND circuit 131 in each of the first comparator 104, the second comparator 105, and the waveform shaping section 103. In this way, the phases of the first strobe signal of the first comparator 104, the second strobe signal of the second comparator 105, and the driver timing of the waveform shaping section 103 can be adjusted in accordance with the corresponding clock domain. Furthermore, the waveform shaping section 103 can shape each test signal substantially in synchronization with the operation clock of the corresponding clock domain. The phase of each test signal can be adjusted in accordance with the corresponding clock domain.

The control section 107 adjusts the phase of the first strobe signal of each first comparator 104, the phase of the second strobe signal of each second comparator 105, and the phase of the driver timing of each waveform shaping section 103, for each corresponding clock domain. The following describes the phase adjustment performed for each clock domain.

The control section 107 includes a control table. The control table stores, in association with each of a plurality of addresses, enable information and disable information for enabling or disabling operation of the judging section 106 and the first comparator 104, the second comparator 105, and the waveform shaping section 103 of each clock domain.

FIG. 4 shows an exemplary control table. The control table records, for each address, enable information or disable information corresponding to a comparator enable category and an edge shift enable category for each of the first clock domain, second clock domain, third clock domain, and fourth clock domain. When enable information is recorded in the comparator enable category, the control section 107 outputs the control signal of logic H to the AND circuit 136 of the judging section 106 for the clock domain for which the enable information is recorded. As a result, the judging section 106 outputs the comparison result of the logic comparing section 135. Furthermore, when disable information is recorded in the comparator enable category, the control section 107 outputs the control signal of logic L to the AND circuit 136 of the judging section 106 for the clock domain for which the disable information is recorded. As a result, the judging section 106 does not output the comparison result of the logic comparing section 135.

When enable information is recorded in the edge shift enable category, the control section 107 outputs the control signal of logic H to the AND circuit 131 of the waveform shaping section 103 of the clock domain for which the enable information is recorded. As a result, the AND circuit 131 outputs the resolution "a" stored in the resolution setting section 121 for each cycle of the rate signal. When disable information is recorded in the comparator enable category, the control section 107 outputs the control signal of logic L to the AND circuit 131 of the waveform shaping section 103 of the clock domain for which the disable information is recorded. As a result, the AND circuit 131 does not output the resolution. The enable information and disable information include information for enabling or disabling part of each of the first comparators 104, second comparators 105, and waveform shaping sections 103. In other words, the enable information and the disable information include information for enabling or disabling the output of the resolution "a" by the AND circuits 131. The control section 107 includes an address pointer. The address pointer designates an address. The address pointer stores an address. The address pointer designates the stored address.

The control section 107 reads from the control table the information recorded at the address designated by the address pointer in each comparator enable category and edge shift enable category corresponding to the first clock domain, the second clock domain, the third clock domain, and the fourth clock domain. The control section 107 then outputs the control signal to the AND circuit 131 in each of the first comparators 104-1 to 104-4, the second comparators 105-1 to 105-4, and the waveform shaping sections 103-1 to 103-4.

For example, when address 1 is designated, enable information is recorded in both the comparator enable category and the edge shift enable category of the first clock domain. Therefore, the control section 107 outputs logic H to the AND circuit 131 in each of the first comparator 104-1, the second comparator 105-1, and the waveform shaping section 103-1 corresponding to the first clock domain. Furthermore, in this case, disable information is recorded in both the comparator enable category and the edge shift enable category for each of the second to fourth clock domains. Therefore, the control section 107 outputs logic L to the AND circuit 131 in each of the first comparators 104, the second comparators 105, and the waveform shaping sections 103 corresponding to the second to fourth clock domains. As a result, when address 1 is designated, the phases of the first strobe of the first comparator 104-1, the second strobe of the second comparator 105-1, and the driver timing of the waveform shaping section 103-1 can be adjusted in accordance with the first clock domain.

When address 2 is designated by the address pointer, enable information is recorded in only the comparator enable category and the edge shift enable category of the second clock domain. Therefore, the control section 107 outputs logic H to the AND circuit 131 in each of the first comparator 104-2, the second comparator 105-2, and the waveform shaping section 103-2 corresponding to the second clock domain. Furthermore, in this case, the control section 107 outputs logic L to the AND circuit 131 in each of the first comparators 104, the second comparators 105, and the waveform shaping sections 103 corresponding to the other clock domains. As a result, when address 2 is designated, the phases of the first strobe of the first comparator 104-2, the second strobe of the second comparator 105-2, and the driver timing of the waveform shaping section 103-2 can be adjusted in accordance with the second clock domain.

When address 3 is designated by the address pointer, enable information is recorded in only the comparator enable category and the edge shift enable category of the third clock domain. Therefore, the control section 107 outputs logic H to the AND circuit 131 in each of the first comparator 104-3, the second comparator 105-3, and the waveform shaping section 103-3 corresponding to the third clock domain. Furthermore, in this case, the control section 107 outputs logic L to the AND circuit 131 in each of the first comparators 104, the second comparators 105, and the waveform shaping sections 103 corresponding to the other clock domains. As a result, when address 3 is designated, the phases of the first strobe of the first comparator 104-3, the second strobe of the second comparator 105-3, and the driver timing of the waveform shaping section 103-3 can be adjusted in accordance with the third clock domain.

When address 4 is designated by the address pointer, enable information is recorded in only the comparator enable category and the edge shift enable category of the fourth clock domain. Therefore, the control section 107 outputs logic H to the AND circuit 131 in each of the first comparator 104-4, the second comparator 105-4, and the waveform shaping section 103-4 corresponding to the fourth clock domain. Furthermore, in this case, the control section 107 outputs logic L to the AND circuit 131 in each of the first comparators 104, the second comparators 105, and the waveform shaping sections 103 corresponding to the other clock domains. As a result, when address 4 is designated, the phases of the first strobe of the first comparator 104-4, the second strobe of the second comparator 105-4, and the driver timing of the waveform shaping section 103-4 can be adjusted in accordance with the fourth clock domain. With the above process, the test signals can be shaped to have timings suitable for each clock domain. Furthermore, the waveform shaping section 103 can shape each test signal substantially in synchronization with the operation clock of the corresponding clock domain.

The control section 107 can set suitable timings for the first strobe signal, second strobe signal, and drive timing corresponding to each clock domain, by shifting each of the first strobe signal, second strobe signal, and driver timing corresponding to a clock domain by substantially the same shift amount. Furthermore, the shift amount of the first strobe signal of the first comparator 104, second strobe signal of the second comparator 105, and driver timing of the waveform shaping section 103 corresponding to a given clock domain may differ from the shift amount of the first strobe signal of the first comparator 104, second strobe signal of the second comparator 105, and driver timing of the waveform shaping section 103 corresponding to another clock domain. Prior to the test signals being input to the DUT 200, i.e. prior to testing, the phase of the first strobe signal of the first comparator 104, the phase of the first strobe signal of the second comparator 105, and the phase of the test signal and driver timing of the waveform shaping section 103 may be adjusted for each clock domain.

Operation of the first comparators 104, second comparators 105, and waveform shaping sections 103 can be dynamically controlled according to instructions of a test program for shaping the test signals. Operation of the first comparators 104, second comparators 105, and waveform shaping sections 103 can be dynamically controlled by incrementing or decrementing the address pointer value according to control commands designated by the test program.

FIG. 5 is a timing chart showing an exemplary operation of the test apparatus 100. The timing chart shows the rate signal and the operation clock signal DQS and data signal DQ of a given clock domain, together with the first strobe signal of the first comparator 104, the second strobe signal of the second comparator 105, and the driver timing of the waveform shaping section 103 corresponding to this clock domain. The operation clock signal DQS and the rate signal are generated independently, and therefore there is a phase difference therebetween, as shown in FIG. 5.

The test apparatus 100 performs one sampling in each cycle of the rate signal. In the present embodiment, T1 represents the initial value of the relative phase with respect to the rate signal of the timing signal T output to the first comparator 104, and has a value of 0. T2 represents the initial value of the relative phase with respect to the rate signal of the timing signal T output to the second comparator 105. T3 represents the initial value of the relative phase with respect to the rate signal of the timing signal T output to the waveform shaping section 103. Therefore, the phase difference of the first strobe signal with respect to the rate signal is 0, the phase difference of the second strobe signal with respect to the rate signal is T2, and the phase difference of the driver timing with respect to the rate signal is T3.

In each cycle of the rate signal, the control section 107 sequentially changes the setting for the respective phase of the first strobe signal with respect to the rate signal. Specifically, the control section 107 changes the settings by inputting logic H to each of the AND circuit 131 of the first comparator 104, the AND circuit 131 of the second comparator 105, and the AND circuit 131 of the waveform shaping section 103. In the present embodiment, in each cycle of the rate signal, the setting for the relative phase of the first strobe signal is increased by "a." At the same time, the control section 107 changes the settings for the relative phases of the second strobe signal and the driver timing by substantially the same amount "a."

At this time, the first comparator 104 detects the logic value of the operation clock signal DQS of the clock domain corresponding to the first comparator 104, at the timing indicated by the first strobe signal. In FIG. 5, a logic value L is detected in the first and second cycles of the rate signal, and a logic value H is detected in the third cycle of the rate signal.

By comparing the logic value of the operation clock signal DQS output by the first comparator 104 and a prescribed expected value, the judging section 106 judges whether the phases match. Here, the prescribe expected value is logic H. Accordingly, in the third cycle of the rate signal, the judging section 106 determines that the phases match. When the judging section 106 judges that the phases match, the control section 107 stops changing the settings for the relative phases of the first strobe signal, the second strobe signal, and the driver timing signal. Specifically, the control section 107 stops changing the setting by inputting logic L to the AND circuit 131 of the first comparator 104, the AND circuit 131 of the second comparator 105, and the AND circuit 131 of the waveform shaping section 103.

At this time, the data storage section 133 of the first comparator 104, the data storage section 133 of the second comparator 105, and the data storage section 133 of the waveform shaping section 103 each store a data value as the shift amount. In the example of FIG. 5, the data storage section 133 of the first comparator 104, the data storage section 133 of the second comparator 105, and the data storage section 133 of the waveform shaping section 103 store 2a as the relative phase, and therefore the test signal supplied from the waveform shaping section 103 to the corresponding clock domain of the DUT 200 has a prescribed phase difference T3 with respect to the operation clock signal DQS of this clock domain. Furthermore, the second comparator 105 samples the data signal DQ output by the corresponding clock domain. At this time, the strobe signal of the second comparator 105 has a phase difference of T2+2a with respect to the rate signal. The data signal DQ may be output in synchronization with the operation clock signal DQS.

In this way, the waveform shaping section 103 shapes the test signal based on the phase difference between the rate signal and the operation clock signal DQS of the corresponding clock domain of the DUT 200 and synchronizes the test signal with the operation clock signal DQ of the corresponding clock domain, thereby enabling proper testing of the DUT 200. Furthermore, each of the waveform shaping sections 103-1 to 103-4 generates the test signal based on the test pattern, according to the phase difference of the operation clock signal of the corresponding clock domain with respect to the rate signal. The shaped test signal is substantially synchronized with the operation clock signal of the corresponding clock domain.

FIG. 6 shows an exemplary command group included in the test program supplied to the control section 107. The first line of this test program sets a number obtained by dividing the number of clock domains by 1. The second line increments the value recorded in the address pointer. Here, 0 is recorded as the initial value, and therefore the incrementing results in an address value of 1. The control section 107 then reads the information recorded at the address designated by the address pointer in the comparator enable and edge shift enable categories of each of the first clock domain, second clock domain, third clock domain, and fourth clock domain in the control table. The control section 107 then outputs the control signal to the AND circuit 131 in each of the first comparators 104, the second comparators 105, and the waveform shaping sections 103. When the address value is 1, the control signal of logic H is transmitted to the first comparator 104-1, the second comparator 105-2, and the waveform shaping section 103-1, and the control signal of logic L is transmitted to the other first comparators 104, second comparators 105, and waveform shaping sections 103. Each clock domain outputs an operation clock signal DQS and a data signal DQ, and therefore each clock domain is represented as a DQ/DQS pair in this test program.

The third line causes each of the first comparators 104-1 to 104-4 to detect the logic value of the operation clock signal DQS of the corresponding clock domain, at the timing indicated by the corresponding first strobe signal. The control section 107 continues transmitting the control signal of logic H to the first comparators 104, the second comparators 105, and the waveform shaping sections 103 corresponding to the enable information, until the judging section 106 judges that the logic value output by each of the first comparators 104-1 to 104-4 matches the expected value. At this time, the AND circuits 131 receiving the control signal of logic H output the resolution "a" in each cycle of the rate signal. Specifically, the AND circuits 131 do not output the resolution "a" in the first cycle of the rate signal, and begin outputting the resolution "a" from the second cycle onward. When the judging section 106 judges a match, the command in the fourth line causes the same process to be repeated for another clock domain. At this point, the program returns to the second line, the address pointer value is incremented, and the above process is repeated. The process is repeated the number of times set by the first line. Since the value set in the first line is 3 in this case, the process is repeated 3 times. When the process has been performed for all of the clock domains, the address pointer value is set to the initial value of 0, according to the fifth line.

By using the control table in this way, a suitable test signal can easily be shaped for each clock domain. Furthermore, the waveform shaping section 103 can shape each test signal substantially in synchronization with the operation clock of the corresponding clock domain.

The first comparators 104 and the judging section 106 are included in the phase comparing section of the present invention. In the present embodiment, for each clock domain, an operation clock signal of the clock domain acquired from a terminal of the device under test included in the clock domain is received, and a phase difference of the operation clock signal of each domain clock with respect to the rate clock is detected. In order to achieve this operation, the first strobe signal is delayed with respect to the rate signal until the first phase signal matches the operation clock signal, at which point the delay amount at the time when matching is achieved is detected as the phase difference. Furthermore, the resolution "a" is included in the delay amount of the present invention. The resolution setting section 121 is included in the delay amount storage section of the present invention. The waveform shaping sections of the present invention each shape a test signal based on the test pattern and shift the phase of the shaped test signal according to the phase difference detected by the phase difference detecting section to substantially synchronize the test signal with the operation clock signal DQS of the corresponding clock domain, and this operation is included in the scope of shaping a test signal.

The following modifications may be applied to the embodiment described above.

(1) In the above embodiment, instead of a configuration using an address pointer or the like such that only one address can be selected, a configuration may be used by which enabling or disabling can be selected for each address in the control table. For example, a second control table may be provided in which addresses are stored in association with table disable information that disables the control table or table enable information that enables the control table. For addresses corresponding to table enable information stored in the second control table, when every corresponding address in the control table stores enable information or when one of the corresponding addresses in the control table stores enable information, the operation of the first comparators 104, second comparators 105, and waveform shaping sections 103 is enabled.

FIG. 7 shows an exemplary second control table. As shown by the FIG. 7, information for enabling or disabling the control table is recorded for each address in the second control table. The second control table designates addresses storing enable information. Here, enable information is stored in addresses 2 and 3, and therefore the addresses 2 and 3 are designated. FIG. 8 shows an exemplary state of a control table. Addresses 2 and 3 are designated, and upon referencing FIG. 8, it can be seen that enable information is recorded in address 2 but disable information is recorded in address 3. Enable information is given a value of 1 and disable information is given a value of 0. When the AND of these two values is calculated, the result for the comparator enable category is disable information. By combining the control table information and the second control table information in this way, fewer bits are necessary than in a case where enabling or disabling is designated by a single control table. In the above calculation, the OR may be calculated instead of the AND. Furthermore, the control table shown in FIG. 4 may be used.

(2) In the above embodiment, control information is provided in a comparator enable category and an edge shift enable category of the control table, but control information may be provided for other categories. For example, a test signal output section may be provided between the DUT 200 and each of the waveform shaping sections 103-1 to 103-4. The test signal output from the waveform shaping section 103 corresponding to each test signal output section is supplied to the corresponding clock domain. In this case, a driver enable category may be included in the control table, and output of the driver may be stopped when this output is unnecessary, in order to minimize the effect of noise on other clock domains. In other words, the control table may further record, in association with each address, enable information or disable information for enabling or disabling an operation of a test signal output section corresponding to each clock domain.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test including a plurality of clock domains, the test apparatus comprising:
a period generator that generates a rate signal for determining a test period corresponding to an operation period of the device under test;
a pattern generator that generates a test pattern;
phase comparing sections that, for each clock domain, receive an operation clock signal of the clock domain acquired from a terminal of the device under test included in the clock domain, and detect a phase difference of the operation clock signal of the clock domain with respect to the rate signal; and
a plurality of waveform shaping sections that are provided respectively to the clock domains, and that each shape a test signal based on the test pattern, according to the phase difference of the corresponding clock domain, to substantially synchronize the test signal with the operation clock signal of the corresponding clock domain.

2. The test apparatus according to claim 1, further comprising a control table that stores, in association with each of a plurality of addresses, enable information or disable information for enabling or disabling operation of the phase comparing section and the waveform shaping section of each clock domain, wherein
the operation of the phase comparing sections or the waveform shaping sections is dynamically controlled according to designation of the addresses by a test program for shaping the test signals.

3. The test apparatus according to claim 2, further comprising an address pointer that stores the addresses, wherein
a pointer value of the address pointer is incremented or decremented by control commands designated by the test program to dynamically control the operation of the phase comparing sections or the waveform shaping sections.

4. The test apparatus according to claim 3, further comprising a delay amount storage section that stores delay amounts for the waveform shaping sections, wherein
each waveform shaping section repeats a delay operation using a delay amount stored in the delay amount storage section one or more times to shape the test signal according to the phase difference.

5. The test apparatus according to claim 4, further comprising a plurality of test signal output sections that correspond respectively to the clock domains and that each supply the device under test with a delayed test signal of the corresponding clock domain, wherein the control table further stores, in association with each of the addresses, enable information or disable information for enabling or disabling operation of the test signal output section of each clock domain.

6. The test apparatus according to claim 2, further comprising a second control table that stores, in association with each of a plurality of addresses, table enable information or table disable information for enabling or disabling the control table, wherein for addresses corresponding to table enable information stored in the second control table, when every corresponding address in the control table stores enable information or when one of the corresponding addresses in the control table stores enable information, the operation of the phase comparing sections or the waveform shaping sections is enabled.

7. A test method for testing a device under test including a plurality of clock domains, the test method comprising:

generating a rate signal for determining a test period corresponding to an operation period of the device under test;

generating a test pattern;

for each clock domain, receiving an operation clock signal of the clock domain acquired from a terminal of the device under test included in the clock domain, and detecting a phase difference of the operation clock signal of each domain clock with respect to the rate clock; and for each clock domain, forming a test signal based on the test pattern, according to the phase difference of the corresponding clock domain, to substantially synchronize the test signal with the operation clock signal of the corresponding clock domain.

* * * * *